(12) United States Patent
Venkitachalam et al.

(10) Patent No.: US 7,741,716 B1
(45) Date of Patent: Jun. 22, 2010

(54) INTEGRATED CIRCUIT BOND PAD STRUCTURES

(75) Inventors: Girish Venkitachalam, San Jose, CA (US); Irfan Rahim, San Jose, CA (US); Peter John McElheny, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 993 days.

(21) Appl. No.: 11/269,301

(22) Filed: Nov. 8, 2005

(51) Int. Cl.
*H01L 23/44* (2006.01)
*H01L 23/52* (2006.01)
*H01L 29/40* (2006.01)

(52) U.S. Cl. ............... 257/758; 257/759; 257/760; 257/784; 257/779; 438/612; 438/618; 438/109; 438/106

(58) Field of Classification Search ............... 257/758
See application file for complete search history.

(56) References Cited

U.S. PATENT DOCUMENTS

| | | | | |
|---|---|---|---|---|
| 5,149,674 | A * | 9/1992 | Freeman et al. | 438/612 |
| 5,502,337 | A * | 3/1996 | Nozaki | 257/773 |
| 5,514,892 | A * | 5/1996 | Countryman et al. | 257/355 |
| 5,847,466 | A * | 12/1998 | Ito et al. | 257/775 |
| 5,942,800 | A | 8/1999 | Yiu et al. | |
| 6,163,074 | A * | 12/2000 | Lee et al. | 257/734 |
| 6,232,662 | B1 * | 5/2001 | Saran | 257/750 |
| 6,236,114 | B1 | 5/2001 | Huang et al. | |
| 6,297,562 | B1 | 10/2001 | Tilly | |
| 6,297,563 | B1 * | 10/2001 | Yamaha | 257/781 |
| 6,313,537 | B1 * | 11/2001 | Lee et al. | 257/758 |
| 6,465,895 | B1 * | 10/2002 | Park et al. | 257/782 |
| 6,501,186 | B1 | 12/2002 | Yu et al. | |
| 6,522,021 | B2 * | 2/2003 | Sakihama et al. | 257/784 |
| 6,524,942 | B2 | 2/2003 | Tsai et al. | |
| 6,551,916 | B2 | 4/2003 | Lin et al. | |
| 6,552,438 | B2 * | 4/2003 | Lee et al. | 257/784 |
| 6,566,752 | B2 * | 5/2003 | Hsia et al. | 257/734 |
| 6,614,091 | B1 * | 9/2003 | Downey et al. | 257/499 |
| 6,703,286 | B1 | 3/2004 | Yu et al. | |
| 6,709,965 | B1 | 3/2004 | Chen et al. | |
| 6,717,270 | B1 * | 4/2004 | Downey et al. | 257/758 |
| 6,838,769 | B1 | 1/2005 | Chittipeddi et al. | |
| 6,875,682 | B1 | 4/2005 | Liu et al. | |
| 6,890,828 | B2 | 5/2005 | Horak et al. | |
| 7,354,798 | B2 * | 4/2008 | Pogge et al. | 438/109 |

(Continued)

*Primary Examiner*—Charles D Garber
*Assistant Examiner*—Pape Sene
(74) *Attorney, Agent, or Firm*—Treyz Law Group; G. Victor Treyz; David C. Kellogg

(57) ABSTRACT

Integrated circuit bond pads are provided for forming wire bonds to integrated circuit package pins. Each pad uses a bond pad structure that provides room for under-pad circuitry. The under-pad circuitry can be connected to other circuitry on the integrated circuit, thereby providing efficient use of circuit real estate. The bond pad structures are formed in the dielectric stack portion of the integrated circuit using dummy bond pads and bond pad support structures. Bond pad support structures may be formed from metal in metal interconnect layers. Vias may be used to connect the bond pad support structures to each other and to the dummy bond pads. Bond pad support structures may be formed in a polysilicon layer at the bottom of the dielectric stack. A contact layer contains metal plugs that connect the polysilicon bond pad support structures to the lowermost metal-layer bond pad support structures.

20 Claims, 12 Drawing Sheets

U.S. PATENT DOCUMENTS

| | | | |
|---|---|---|---|
| 2003/0234448 A1* | 12/2003 | Batra et al. | 257/758 |
| 2005/0093176 A1* | 5/2005 | Hung et al. | 257/786 |
| 2005/0121804 A1* | 6/2005 | Kuo et al. | 257/781 |
| 2005/0202221 A1* | 9/2005 | Wang et al. | 428/209 |
| 2005/0212141 A1* | 9/2005 | Anzai | 257/773 |
| 2006/0065969 A1* | 3/2006 | Antol et al. | 257/700 |
| 2006/0103031 A1* | 5/2006 | Wu | 257/781 |

* cited by examiner

INTEGRATED CIRCUIT BOND PAD STRUCTURES

BACKGROUND

The present invention relates to integrated circuit bond pads, and more particularly, to structures that allow for active circuitry to be formed under a bond pad.

Integrated circuits are formed from silicon wafers. After a wafer of circuits has been fabricated, the wafer is diced into individual die. Each die is mounted in an integrated circuit package. Packaged integrated circuits are typically mounted on circuit boards.

Integrated circuit die can be electrically connected to package pins using wire bonding techniques.

Each die has wire bond pads around its periphery. After a die has been mounted in an integrated circuit package, a wire bonding tool attaches wires between the wire bond pads on the die and the pins on the package. The bond pads and wires electrically connect the circuitry of the integrated circuit to the package pins, so that the circuitry can be used in a system.

The process by which the wires are attached to the bond pads and package pins is called wire bonding. Wire bonding tools typically form wire bonds using a combination of ultrasonic energy, heat, and pressure. A successful wire bond will remain reliable for many years.

One measure of wire bond quality is pull test performance. During a pull test, a wire bond is pulled to measure its strength. A bond exhibiting a poor pull test performance will not be reliable.

To address concerns about wire bond reliability, bond pad structures have been developed in which interconnect layers under each pad are patterned in a way that enhances the strength of the bond pad and any bond made to that pad. While these types of structures exhibit satisfactory pull test performance, they consume all of the real estate under the pad.

Modern circuits are becoming increasingly complex, which is forcing circuit designers to use circuit real estate as efficiently as possible. One possible way to use circuit real estate more efficiency is to use the area under the bond pads to form active circuits. Bond pads are fairly large, so significant efficiency gains can be realized by using the area under the pads for circuitry rather than for providing structural support for the pads.

Bond pad structures have been developed that free up some of the area under the pads for circuitry. In these structures, the uppermost interconnect layers are used to strengthen the pad, while the lower interconnect layers are left untouched. Because the lower interconnect layers under the pads are not used for structural support, they can be used for active circuitry.

Conventional bond pad structures of this type satisfy the need for additional circuit real estate, but are not always sufficiently robust. The interconnect layers in the dielectric stack under the pad can be fragile, which renders them susceptible to damage during the wire bonding process. Moreover, pad structures of this type sometimes exhibit unsatisfactory pull test performance. These problems can be particularly acute in integrated circuits with low-dielectric-constant dielectric stack materials and small bond pads.

It would therefore be desirable to be able to provide integrated circuit bond pad structures that accommodate under-pad circuitry while exhibiting improved structural qualities.

SUMMARY

The present invention provides integrated circuit bond pads for forming wire bond connections between an integrated circuit and integrated circuit package pins. The bond pads are formed using bond pad metal formed in squares, rectangles, or other suitable bond pad shapes. The bond pad metal is located on the top of the integrated circuit's dielectric stack. The dielectric stack includes alternating metal interconnect layers and via interconnect layers. The resources in the dielectric stack are patterned to form interconnects. The interconnects connect the circuitry on the integrated circuit so that it performs its desired functions.

The bond pad metal has an area. Bond pad support structures formed under the bond pad help to strengthen the bond pad. The bond pad support structures typically have areas that are significantly less than the bond pad area. For example, each bond pad support structure might have an area of less than 5% of the total pad area. Because the bond pad support structures do not consume all of the real estate under the bond pad metal, circuitry can be formed under the bond pad.

The bond pad support structures may, for example, be squares formed in the metal interconnect layers of the dielectric stack. In each metal interconnect layer, the bond pad support structures are configured to define gaps. The gaps allow interconnects to pass from the region directly beneath the bond pad metal to areas on the integrated circuit that are not beneath the bond pad metal. When passing through the gaps, the interconnects are not shorted to the bond pad support structures. This allows the under-pad circuitry to be electrically connected to the circuitry on the integrated circuit that is not under the pad without electrical interference from the bond pad support structures.

With one suitable arrangement, the bond pad support structures are aligned to form pillars that extend from the top to the bottom of the dielectric stack.

Dummy bond pads may be used to strengthen the bond pad structure. With one suitable arrangement, upper and lower dummy bond pads are formed using solid metal plates or islands of metal in the uppermost two metal interconnect layers. The upper dummy bond pad is directly connected to the bond pad metal. The lower dummy bond pad is connected to the upper dummy bond pad using vias in the uppermost via interconnect layer.

Bond pad support structures in the uppermost metal interconnect layer not containing a dummy bond pad are connected to the lower bond pad using vias. Lower bond pad support structures are aligned in vertical columns and are interconnected using vias in other via interconnect layers.

At the bottom of the dielectric stack, a contact layer is used to form metal plugs. A polysilicon layer formed on top of the integrated circuit's silicon substrate is used to form polysilicon bond pad support structures. The metal plugs in the contact layer connect the polysilicon bond pad support structures to corresponding bond pad support structures in the lowermost metal interconnect layer.

Further features of the invention, its nature and various advantages will be more apparent from the accompanying drawings and the following detailed description of the preferred embodiments.

DETAILED DESCRIPTION

The present invention relates to integrated circuit bond pad structures. The bond pad structures of the present invention may be incorporated into any suitable integrated circuit, such as an application-specific-integrated circuit, a digital signal processing circuit, a microprocessor, a programmable logic device integrated circuit, or any other suitable analog or digital circuit.

Figure 1:
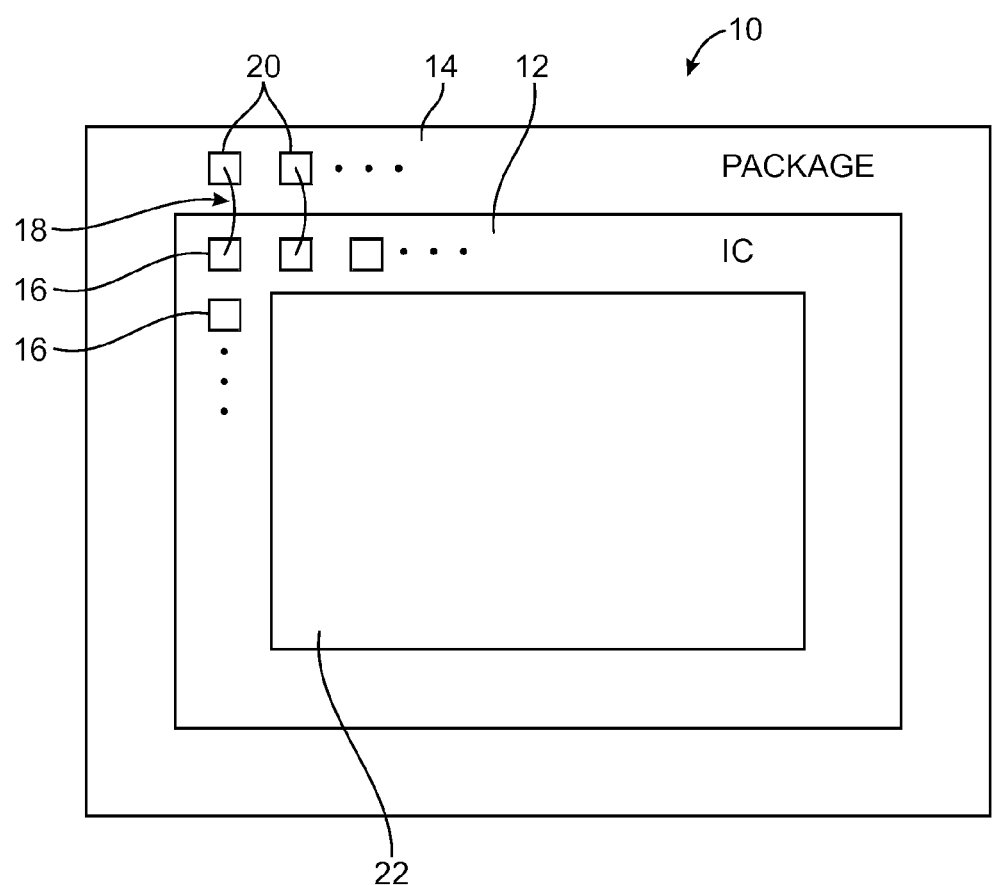
FIG. 1 is a top view of an integrated circuit layout that is used in conventional integrated circuits and integrated circuits that include bond pad structures in accordance with the present invention.

A top view of a packaged integrated circuit 10 is shown in FIG. 1. In the packaged integrated circuit 10 of FIG. 1, an integrated circuit die 12 is mounted to an integrated circuit package 14. The integrated circuit die 12, which is sometimes referred to as an integrated circuit chip or an integrated circuit, has a number of bond pads 16. The bond pads 16 are arranged around the periphery of the integrated circuit 12. During packaging, a wire bonding tool is used to attach wires 18 between wire bond pads 16 and corresponding package pins 20 on package 14.

The package pins 20 have portions that extend out of the package 14. When the packaged integrated circuit 10 is installed on a circuit board, the portions of the pins 20 that extend out of the package 14 are typically soldered to traces on the board.

The wire attachment process involves forming a bond between each end of the wire and its respective attachment point. At the integrated circuit end of each wire 18, the wire is bonded to one of the pads 16 on the integrated circuit die 12. At the package end of each wire 18, the wire is bonded to one of the pins 20.

The wire attachment process is called wire bonding. Modern wire bonding tools typically use a combination of pressure, heat, and ultrasonic energy to form wire bonds. Care must be taken not to damage circuitry on integrated circuit 12 when forming wire bonds. If the bonding process is too harsh, circuitry in the vicinity of pads 16 may be damaged. Even a single damaged circuit may render the entire packaged integrated circuit inoperable. At the same time, high-quality wire bonds must be formed to ensure satisfactory bond reliability. If the bonding process is too weak, the bonds will be prone to failure.

Figure 2:
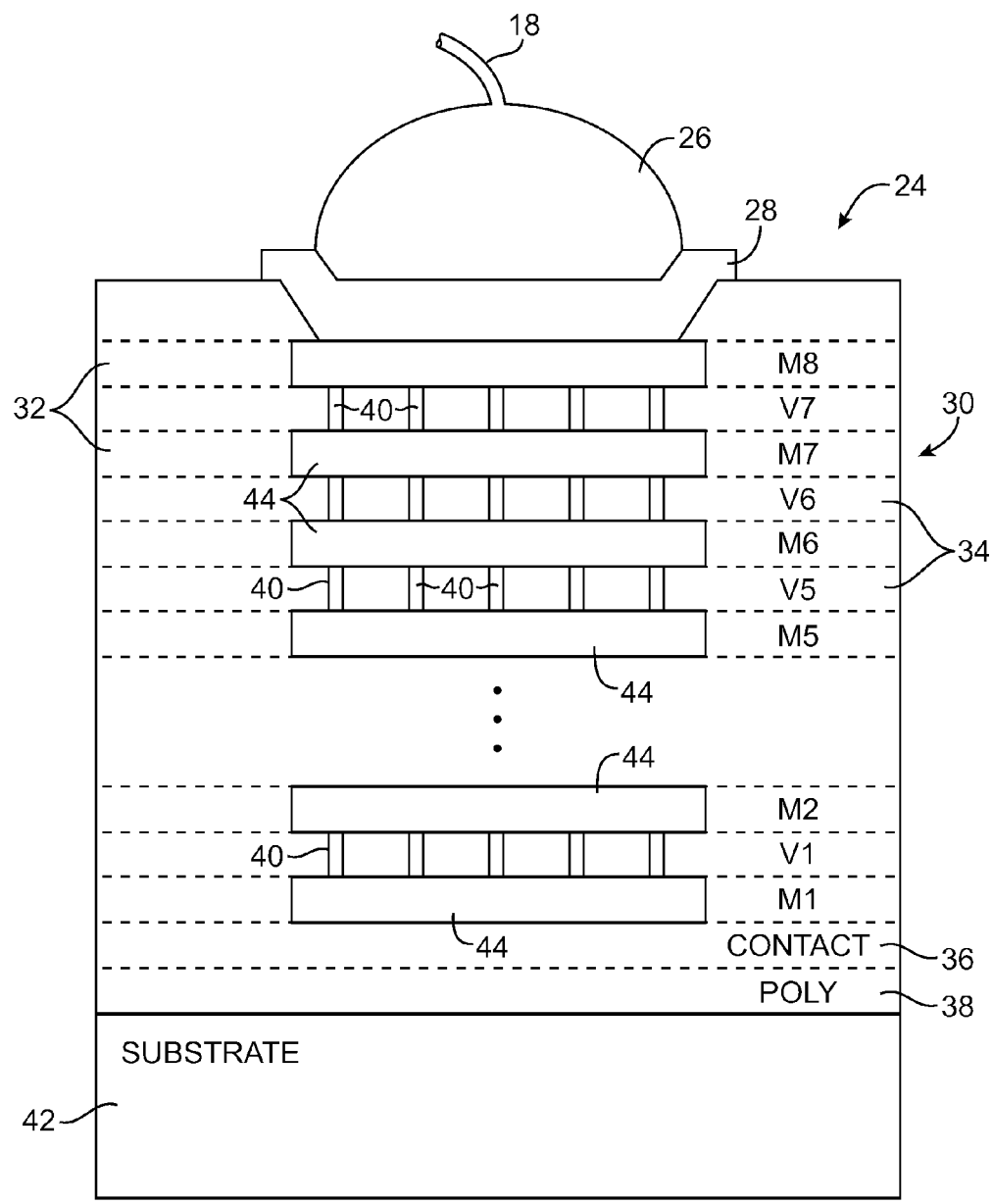
FIG. 2 is a cross-sectional side view of a conventional bond pad structure in which the underlying interconnect layers have been patterned to enhance the stability of the bond pad.

One way to address reliability concerns is to enhance the structural strength of the bond pads by appropriate patterning of interconnect layers lying under the pads. A conventional bond pad structure 24 whose strength has been enhanced in this way is shown in FIG. 2. In the structure of FIG. 2, a wire bond is formed by attaching wire 18 to bond pad metal 28. There is typically a ball-shaped portion 26 of wire 18 at each wire bond. During wire bonding, the ball portion 26 of wire 18 becomes fused to the bond pad metal 28. A typical bond pad metal layer 28 has an area of 50×50 µm when viewed from the top.

As shown in the cross-sectional side view of FIG. 2, the bond pad metal 28 is formed on top of a dielectric stack 30. Elsewhere on the integrated circuit of which the bonding pad structure 24 of FIG. 2 is a part, the dielectric stack contains interconnect routing structures that route signals on the integrated circuit.

The dielectric stack is formed on top of integrated circuit substrate 42. Substrate 42 is formed from crystalline silicon. Transistors, diodes, and other active devices are formed from substrate 42. Signals are routed between these devices using the routing capabilities of the dielectric stack 30.

The dielectric stack includes a top metal interconnect layer 32 and a number of lower metal interconnect layers 32. In FIG. 2, the top metal interconnect layer 32 is labeled "M8", because the fabrication process used to form the circuit of FIG. 2 uses eight metal interconnect layers 32. The lower metal interconnect layers 32 are labeled M7, M6, . . . M1. The bond pad metal layer may be used for routing, but is generally not referred to as a "metal interconnect layer".

During fabrication, the metal interconnect layers are patterned to form conductive routing paths, which are sometimes called interconnects. These paths are typically a micron or less in width and are used to interconnect devices on the integrated circuit so that they perform desired circuit functions. Via interconnect layers 34 are used to form short vertical conductors called vias that are used to connect interconnects in adjacent layers. The via interconnect layers 34 are labeled V7, V6, . . . V1.

As shown in FIG. 2, a via 40 in via interconnect layer V7 can be used to connect an interconnect in the M8 layer to an interconnect in the M7 layer. Similarly, a via 40 in the V1 via layer may be used to interconnect an M2 interconnect to an M1 interconnect.

When used to connect interconnects in adjacent metal interconnect layers, vias 40 are sometimes used in isolation. For example, if a particular routing path requires that an electrical connection be made between a line in the M4 layer and a line in the M5 layer, these Lines can typically be electrically connected to each other using a single via. In the bond pad structure of FIG. 2, numerous vias 40 are connected between respective pad-shaped metal interconnect regions 44. Each of these regions 44 is typically a square plate or a series of parallel strips formed from the metal interconnect layer. Because regions 44 may have the same shape as bond pad metal 28, regions 44 are sometimes referred to as dummy pads. Only five vias are shown in each via layer to avoid over-complicating FIG. 2. In general, there are many more vias between each layer. Typical vias have lateral dimensions on the order of 0.5 μm, so there might be hundreds of vias between two respective dummy pads.

In both the metal interconnect layers 32 and the via interconnect layers 34, some of the layer makes up conductive pathways and some of the layer is insulating dielectric (i.e., silicon oxide). In the metal interconnect layers 32, dielectric surrounds dummy pads 44 and interconnects. In the via interconnect layers 34, dielectric surrounds vias 40.

There is typically a polysilicon layer 38 adjacent to the silicon substrate. This layer is generally patterned to form transistor gates and other device structures in areas not under bond pad metal 28. Contact layer 36 is a via-type layer in which short vertical conductors are formed using tungsten plugs. The tungsten plugs in contact layer 36 are used to electrically connect patterned polysilicon in layer 38 to patterned metal in the M1 metal interconnect layer in areas not under bond pad metal 28.

With the arrangement of FIG. 2, the numerous dummy pad layers 44 and respective groups of vias 40 formed under bond pad metal 28 serve to stabilize and strengthen the pad structure 24. However, this type of approach does not allow circuitry to be formed under the pad. Although portions of the substrate, the polysilicon layer, and the contact layer are not used in structure 24, the presence of the M1 dummy pad 44 and the higher-level dummy pads 44 prevents the formation of under-pad circuitry. Because no circuitry can be formed under pads of the type shown in FIG. 2, the circuitry on an integrated circuit using this type of pad arrangement is confined to the center region 22 of the circuit, as shown in FIG. 1.

Figure 3:
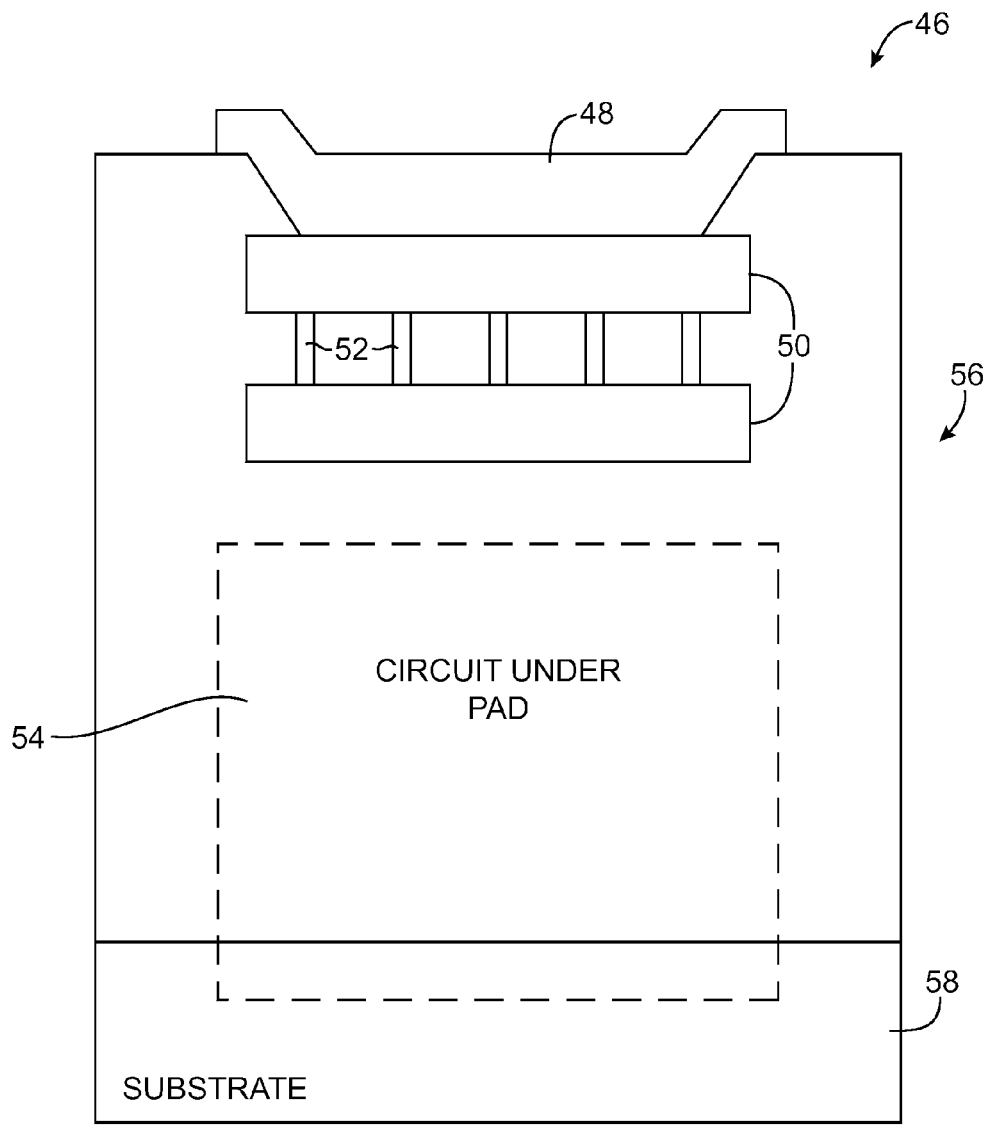
FIG. 3 is a cross-sectional side view of a conventional bond pad structure of the type that may be used to accommodate under-pad circuitry.

A conventional pad structure 46 in which real estate under the pad is available for circuitry is shown in FIG. 3. In the conventional pad structure 46 of FIG. 3, two pad-shaped dummy bond pads 50 are formed under bond pad metal 48 in the two uppermost metal interconnect layers in dielectric stack 56. The top dummy bond pad is directly connected to the bond pad metal. The dummy pads may be formed from solid plates, rings, and uniform arrays of tightly-packed squares. The dummy pads 50 are connected by vias 52. The rest of the metal interconnect layers and via interconnect layers in dielectric stack 56 and the underlying substrate 58 are not used to form the bond pad structure, so these resources are available to a circuit designer to form a circuit 54. Because the circuit 54 uses interconnect and substrate resources that are located under a pad, a circuit such as circuit 54 is sometimes referred to as an under-pad circuit or "circuit under pad."

The conventional bond pad structure 46 of FIG. 3 allows circuit real estate to be used more efficiently than the conventional bond pad structure 24 of FIG. 2, because under-pad resources can be used to form active devices and interconnects. However, because the dummy bond pads 50 in the bond pad structure 46 are confined to the uppermost portions of the dielectric stack 56, the pull test performance of wirebonds formed using structure 46 is not always satisfactory, particularly in dielectric stacks formed from low-dielectric-constant insulators and bond structures with small lateral dimensions (e.g., less than 50 μm).

Figure 4:
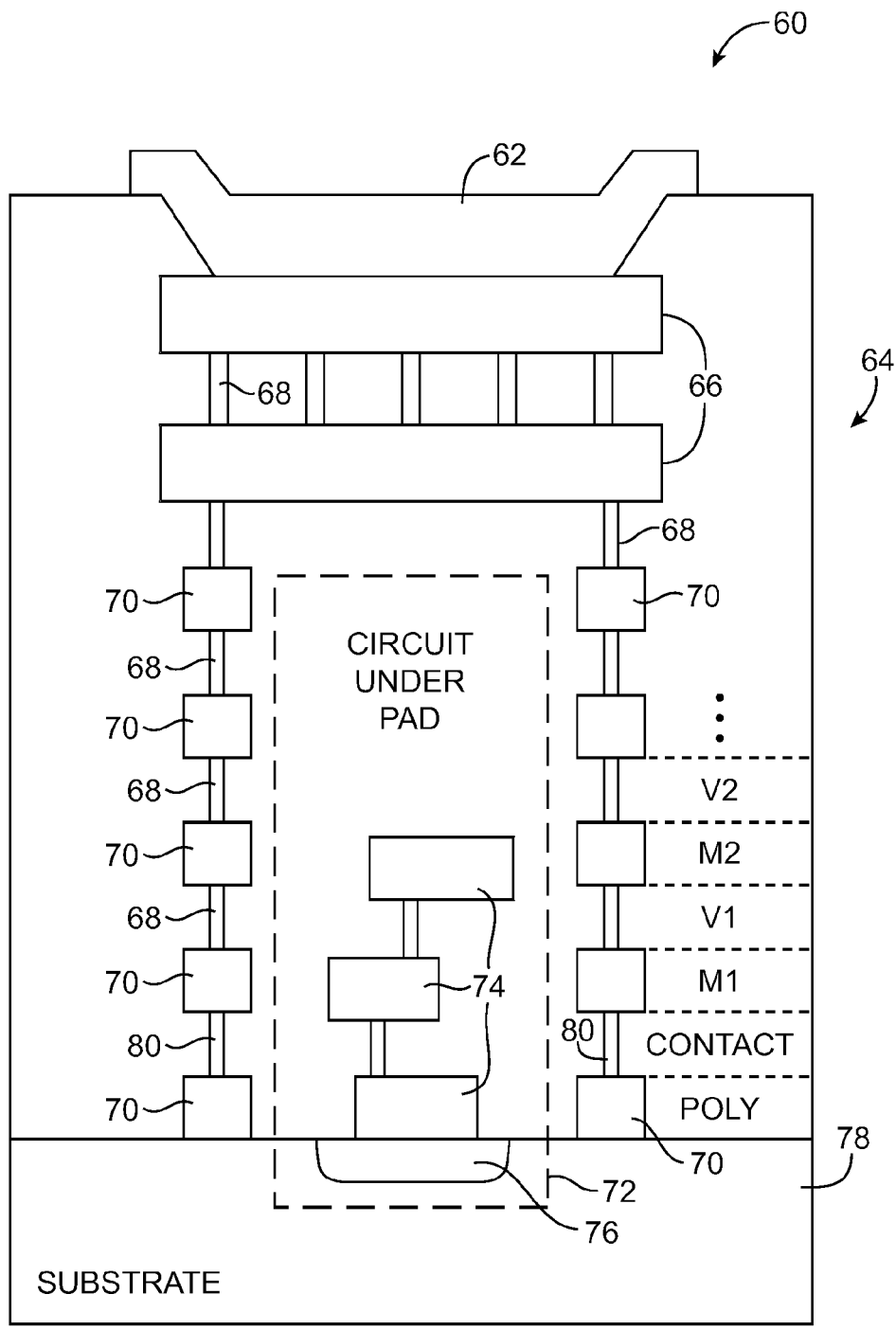
FIG. 4 is a cross-sectional side view of an illustrative bond pad structure in accordance with the present invention.

A bond pad structure 60 in accordance with the present invention is shown in FIG. 4. In a typical implementation, all of the bond pads 16 (FIG. 1) on a given integrated circuit 12 are formed using bond pad structure 60. Each bond pad structure 60 has a square, rectangular, or other appropriate pad-shaped bond pad metal region 62. Typical pad dimensions are 50 μm×50 μm when viewed from the top. This is, however, merely illustrative. The bond pad structure 60 may have any suitable lateral dimensions, provided that the area of the bond pad metal 62 is sufficient to form a wire bond.

The uppermost metal interconnect layers in dielectric stack 64 preferably are formed from pad-sized dummy bond pads 66. In the example of FIG. 4, there are two dummy pads 66. This is merely illustrative. If desired, there may be one dummy pad 66, three dummy pads 66, or more than three dummy pads 66. An advantage of using two dummy pads 66 is that sufficient structural support is provided while retaining room for under-pad circuitry in lower layers of the stack.

Underneath the dummy pads 66, pad support structures 70 are used to strengthen the bond pad structure 60. The lowermost pad support structures 70 are formed from a polysilicon layer (labeled "poly" in FIG. 4). The remainder of the pad support structures 70 and the dummy bond pads 66 are formed from metal interconnect layers (e.g., M1, M2, . . . ). Metal plugs 80 in the contact layer of stack 64 and vias 68 in the via interconnect layers (V1, V2, . . . ) are preferably used to connect the structures in the poly layer and metal interconnect layers.

For example, adjacent dummy pads 66 are typically connected by numerous vias 68. There are typically tens or hundreds of vias 68 between respective dummy pads 66, but only five vias 68 are shown in FIG. 4 to avoid over-complicating the drawing. Similarly, there is typically more than just one via 68 and more than one contact-layer plug between each pair of adjacent pad support structures 70, although each pair of adjacent pad support structures 70 is shown as being connected by a single via 68 in the example of FIG. 4.

The dummy pads 66 generally consume most of the area under the pad in the layers in which they are formed. The pad support structures 70, in contrast, do not consume the entire area under the pad and have laterally-spaced gaps. As a result, there is real estate available for forming a circuit under the pad (i.e., under bond pad metal 62 and under dummy pads 66). The circuit under the pad is shown as circuit 72 in FIG. 4.

Any suitable circuit structures may be formed in the space left available under the pad. In the example of FIG. 4, an under-pad region 76 of substrate 78 and several illustrative metal and via interconnect layer structures 74 are shown in circuit 72. These structures are merely illustrative. Any suitable metal and via interconnect patterns and any suitable substrate structures may be formed using the under-pad real estate made available through the use of pad support structures 70.

As shown in FIG. 4, the bond pad structure 60 preferably includes structures that anchor the bond pad metal 62 to the polysilicon layer. In particular, poly-layer bond pad support structures 70 and associated contact-layer plugs 80 are preferably used to connect the substrate 78 to higher layers in the dielectric stack 64. This helps to promote stability and adhesion and creates a stronger bond pad structure than conventional circuit-under-pad arrangements of the type shown in FIG. 2.

The bond pad structure 60 of FIG. 4 may be used in any suitable integrated circuit dielectric stack. In the example of FIG. 4, the bond pad structure 60 includes structures formed from a polysilicon layer, a contact layer, six metal interconnect layers (M1, M2, . . . ), five via interconnect layers (V1, V2, . . . ), and a bond pad metal layer. This is merely illustrative. For example, the bond structures of the present invention may be implemented in dielectric stacks containing any suitable number of metal and via interconnect layers (e.g., seven layers, eight layers, nine layers, or more than nine layers). There may be five layers of bond pad support structures and associated vias, six layers of bond pad support structures and associated vias, or seven, eight, or more layers of bond pad support structures and vias. In a typical arrangement, there are about eight to ten metal interconnect layers and about seven to nine via interconnect layers. As improvements are made to semiconductor fabrication processes in the future, more interconnect layers may be used on integrated circuit 12.

The bond pad metal 62 may be formed from an aluminum copper alloy or other suitable conductive material. The conductive material in the metal interconnect layers and via layers of dielectric stack 64 is typically copper. The conductive material in the contact layer is typically tungsten. The conductive material in the poly layer is polysilicon (e.g., doped silicided polysilicon). The insulating material in the metal and via interconnect layers and in the contact and polysilicon layers may be silicon dioxide or any other suitable insulator. The insulating material preferably has a low dielectric constant to ensure good electrical performance for circuits such as circuit 72 and for circuits formed elsewhere on the integrated circuit in which pad structures such as pad structure 60 are formed. In general, the choice of materials for bond pad structure 60 is dictated by the semiconductor fabrication process being used to fabricate integrated circuit 12. The bond pad structure 60 is preferably formed using standard process steps.

The circuitry under the pad of FIG. 4 is preferably electrically interconnected with other circuitry on the integrated circuit 12. This is possible because the pad support structures 70 do not consume all of the area under the bond pad metal 62. The pad support structures 70 preferably consume only a relatively small portion of the area under the pad, as shown in the cross-sectional top view of the bond pad structure in FIG. 5.

Figure 5:
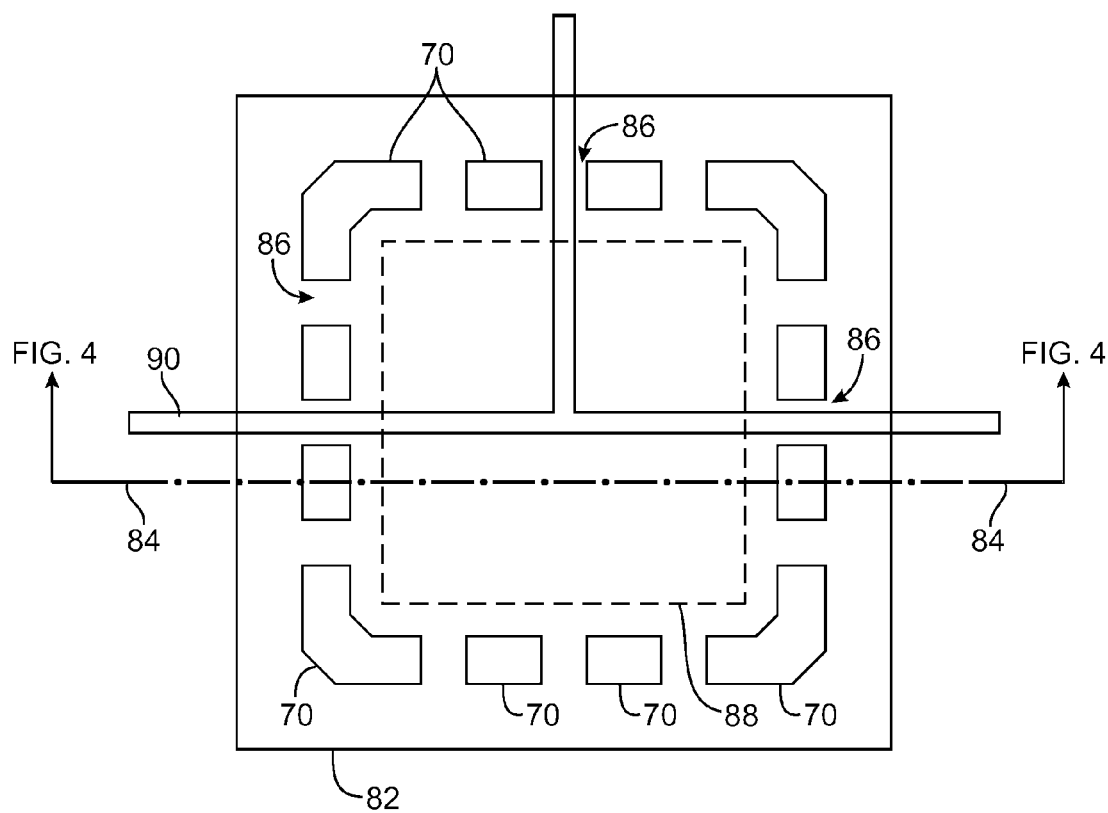
FIG. 5 is a cross-sectional top view of an illustrative bond pad structure in accordance with the present invention.

In the top view of FIG. 5, the boundary 82 represents the outer extent of the pad (i.e., the outer boundary of bond pad metal 62). When dummy pads 66 are solid plates, the boundary 82 of FIG. 5 is typically aligned with the boundaries of the dummy pads 66. Line 84 shows the location of the cross-sectional cut used to form the side view of FIG. 4.

As shown in FIG. 5, the bond pad support structures 70 are generally located within the boundary 82 and lie underneath the bond pad metal 62. There are preferably gaps 86 between respective bond pad support structures 70 that allow interconnects 90 to exit the interior region 88. Region 88 and the gaps 86 represent areas within the bond pad metal footprint that may be used for under-pad circuitry such as under-pad circuit 72 of FIG. 4.

Some or all of the bond pad structures 70 in a interconnect layer are connected to corresponding bond pad structures in an adjacent layer. With one suitable approach, all of the bond pad support structures 70 in each metal interconnect layer are connected to identically-shaped bond pad support structures 70 in another metal interconnect-layer. With another suitable approach, only a subset of the bond pad support structures 70, such as the square bond pad support structures 70 of FIG. 5 are connected to corresponding bond pad support structures 70 in an adjacent layer. With this approach, the remaining bond pad support structures are not connected to corresponding support structures in other layers.

One or more vias 68 or plugs 80 (FIG. 4) are used to form connections between corresponding bond pad support structures 70. In one suitable arrangement, the square bond pad support structures 70 of FIG. 5 are about 5 μm×5 μm in size and each such square bond pad support structure 70 is connected to a corresponding bond pad support structure 70 in adjacent metal interconnect layers using 25 0.5 μm×0.5 μm vias 68. Plugs 80 connect the lowermost metal interconnect layer support structures 70 to corresponding polysilicon support structures 70. An illustrative square bond pad support structure 70 with 25 corresponding vias 68 is shown in the top view of FIG. 6. Plugs 80 can be arranged in the same fashion.

Figure 6:
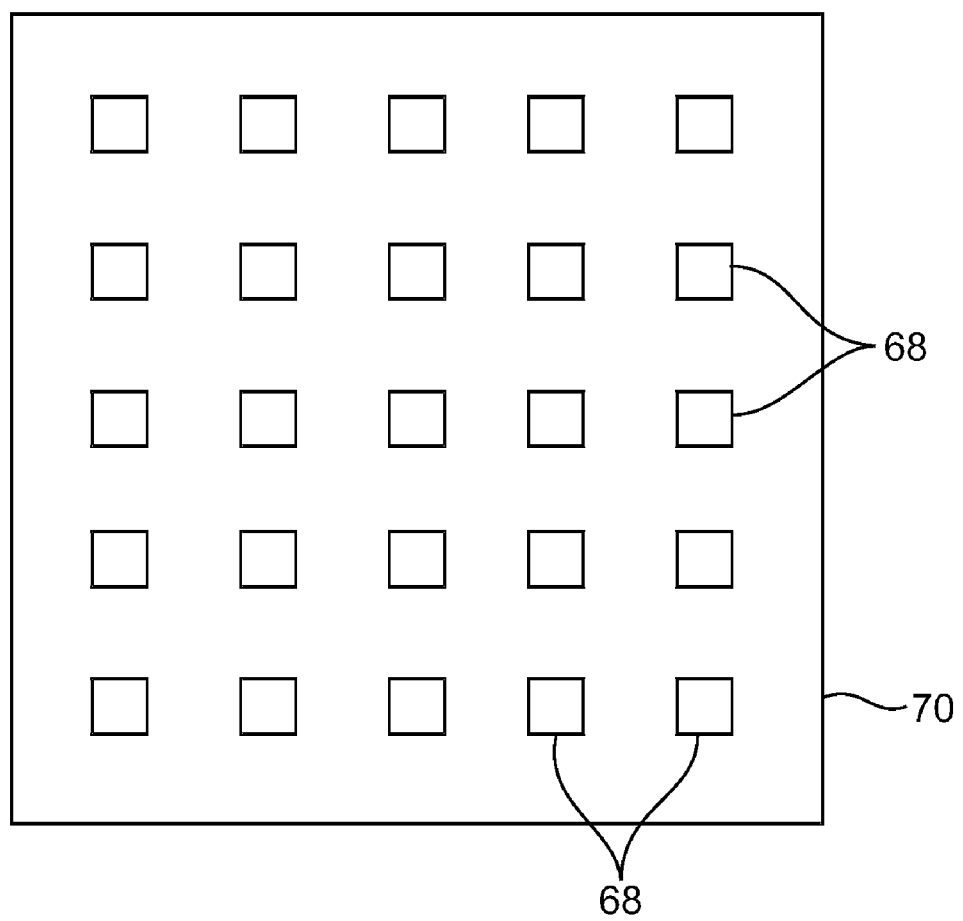
FIG. 6 is a cross-sectional top view of an illustrative bond pad support structure showing illustrative via connections in accordance with the present invention.

The arrangement of FIG. 6 is merely illustrative. In general, bond pad support structures 70 may have any suitable shape and any suitable number of vias 68 and plugs may be used to connect the bond pad support structures 70 in different layers. The use of a 5×5 array of vias 68 (or plugs 80) to connect respective 5 μm×5 μm bond pad support structures 70 in adjacent layers to each other is merely an example. For example, structures larger than 0.5 μm×0.5 μm or structures that have non-square cross-sections may be used to connect bond pad support structures 70. A solid 3 μm×6 μm rectangular shape formed from a part of a via interconnect layer might be used (as an example). In general, however, making vias and contact plugs as small as possible is encouraged or required by the design rules associated with the semiconductor fabrication process that is used to fabricate the integrated circuit 12.

The bond pad arrangement of FIG. 5 has eight square bond pad support structures 70 and four angled bond pad support structures. This arrangement is merely illustrative. There may be no angle bond pad support structures. There may be two or more angled bond pad support structures. There may be two, three, four, five, six, or more than six square bond pad support structures, etc. In general, any suitable layout may be used for the bond pad support structures, provided that the layout leaves at least some of the under-pad real estate available for use by under-pad circuitry.

Examples of layouts that may be used for the bond pad support structures 70 are shown in FIGS. 7-12. As shown by these illustrative layouts, the outline of each bond pad structure 70 typically falls entirely within the pad footprint defined by boundary 82, although this is not required. There are gaps 86 between bond pad support structures 70. Circuit interconnects can be formed that pass through the gaps 86, so signals can be routed to and from the under-pad region within pad boundary 82.

Figure 7:
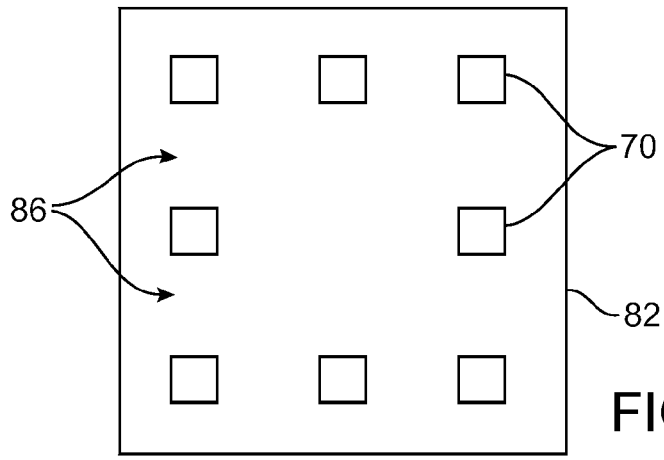
FIGS. 7, 8, 9, 10, 11, and 12 are cross-sectional top views of illustrative bond pad structures in accordance with the present invention.

With the arrangement of FIG. 7, bond pad support structures 70 are distributed around the periphery of the bond pad boundary 82. This type of arrangement provides a large interior area and many gaps 86.

Figure 8:
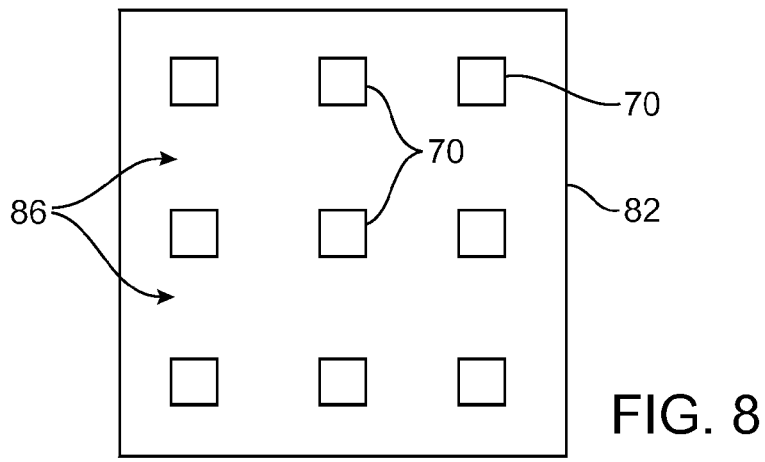

With arrangements of the type shown in FIG. 8, there are one or more interior bond pad support structures 70. This type of arrangement provides more strength to the bond pad, but decreases the available real estate for forming under-pad circuitry.

Figure 9:
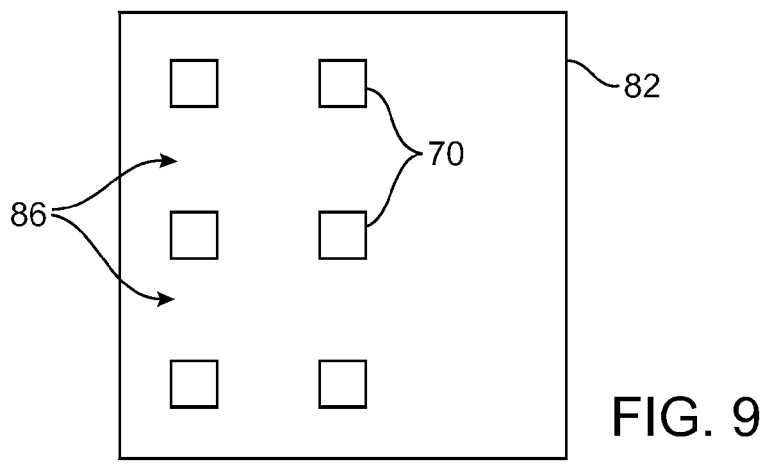

The arrangement of FIG. 9 is asymmetrical, because more bond pad support structures 70 are formed on one side of the bond pad area than on the other. This type of arrangement may be useful to accommodate certain under-pad interconnect layouts.

Figure 10:
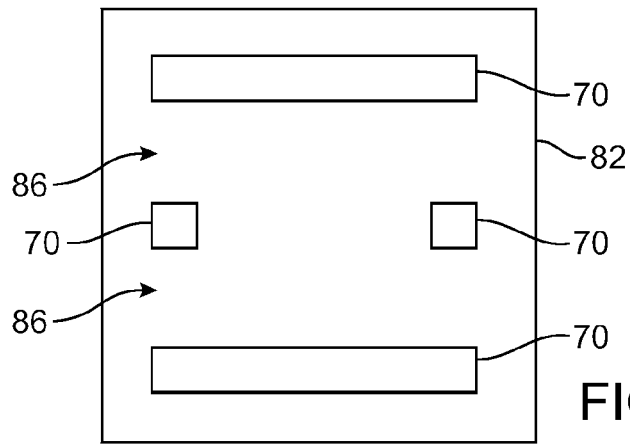

Another possible arrangement for the bond pad support structures 70 of bond pad structure 60 is shown in FIG. 10. The FIG. 10 arrangement has bond pad support structures of different shapes and sizes. In particular, there are two small square-shaped bond pad support structures 70 and two larger rectangular bar-shaped bond pad support structures 70. This type of layout provides a large amount of structural support while still providing several gaps 86 for routing flexibility.

Figure 11:
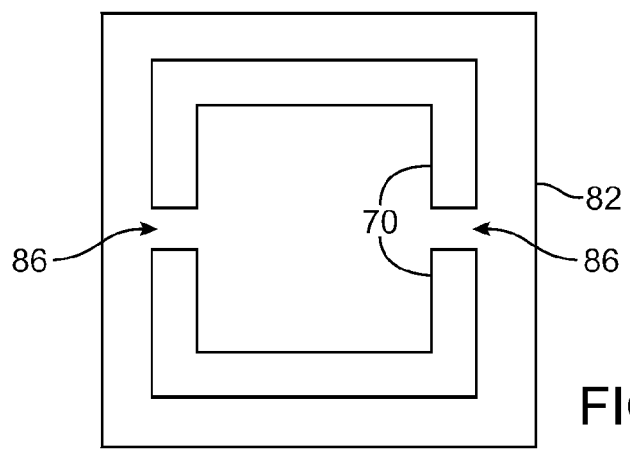

Another arrangement that may be used is shown in FIG. 11. Because the bond pad structure of FIG. 11 has two large semi-circular bond pad support structures 70, there are only two gaps 86. In general, it is preferred to have at least one gap 86 in each layer. A layer using a ring-shaped bond pad support structure layer 70 is possible, but will not permit any interconnects to pass from the region directly under the pad to a region outside of the pad, which restricts the types of under-pad circuits that can be formed. As an example, if the M3 bond pad support structure has a closed ring shape and the M2 and M4 bond pad support structures have intervening gaps 86, it will not be possible for M3 interconnects to laterally exit the M3 ring through a gap. Signals can only be routed out of the M3 ring by forming via connections to M4 or M2 interconnects and using the gaps in those layers to exit from beneath the pad.

Figure 12:
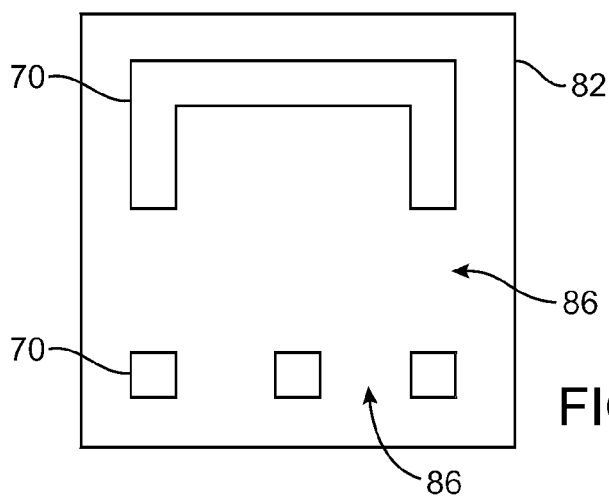

FIG. 12 shows how the bond-support structures 70 can include both smaller square support structures and a larger semi-circular support structure.

As these examples demonstrate, there are a variety of bond pad support structures 70 that may be used to provide strength to the bond pad structures 60 of the present invention. With typical arrangements, the total area consumed by each bond pad support structure is a fraction of the total pad area. For example, if the total pad area is A, the area of each bond pad support structure might be 0.3 A or less, 0.2 A or less, 0.1 A or less (i.e., less than one tenth of the pad area), 0.05 A or less, etc. The total area of all of the bond pad structures 70 in any given layer is typically less than 0.5 A, 0.4 A, 0.3 A, 0.2 A, or 0.1 A.

With an illustrative embodiment of the invention, each bond pad support structure 70 is a small square of less than about 0.05 A in size. There are about 8-12 bond pad support structures 70 in each layer of the dielectric stack. The two uppermost metal interconnect layers are used to form dummy pads 66. Each layer of the bond pad structure below the dummy pads 66, has an identical bond pad support structure layout. For example, nine square bond pad support structures 70 may be formed in the M6 layer, nine identical square bond pad support structures 70 may be formed in the M5 layer directly beneath the corresponding M6 layer structures, and nine identical structures may be formed in each successively lower metal interconnect layer and the polysilicon layer. Groups of vias of the type shown in FIG. 6 may be formed between each successive layer of bond pad support structures 70. A corresponding group of plugs in the contact layer connects the bond pad support structures in the lowermost metal interconnect layer to the bond pad support structures in the polysilicon layer. With this illustrative embodiment, the small square bond pad support structures 70 are vertically stacked to form pillars. The pillars are anchored using the contact layer and polysilicon layer and strengthen the bond pad structure 60 without consuming all of the under-pad real estate.

Figure 13:
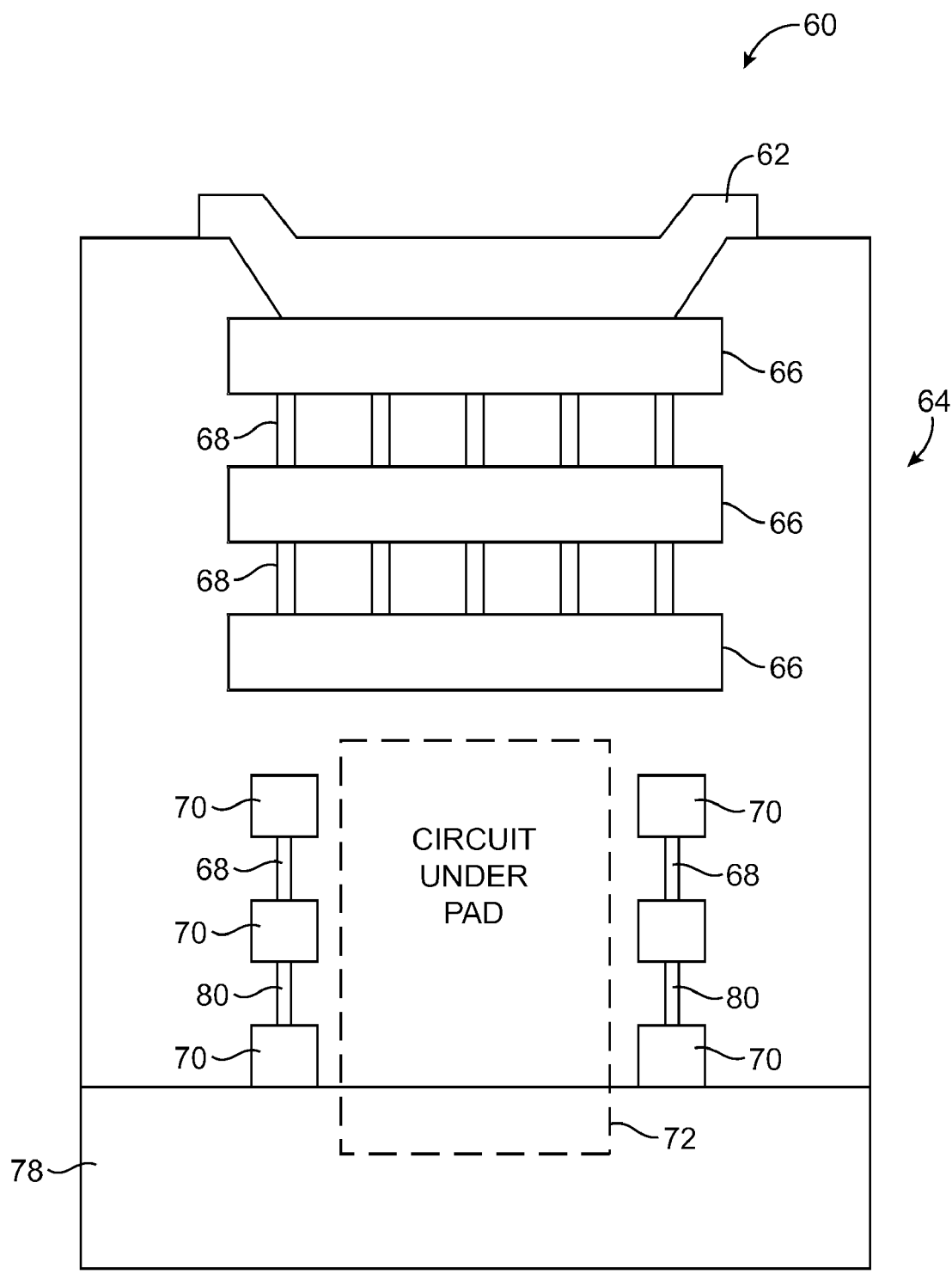
FIGS. 13 and 14 are cross-sectional side views of illustrative bond pad structures in accordance with the present invention.

If desired, the bond pad support structures 70 need not be continuously connected. For example, one or more layers of vias 68 may be omitted, as shown in FIG. 13. In the FIG. 13 example, there are three dummy bond pads 66 and three layers of bond pad support structures 70 in bond pad structure 60. The via layer between the uppermost bond pad support structure layer and the lowermost dummy bond pad 66 has been omitted. Vias 68 and plugs 80 are used, however, to connect the dummy bond pads 66 to each other and to connect the bond pad support structures 70 to each other. Vias 68 can be omitted from any of the layers. For example, vias 68 can be omitted between respective bond pad support structure layers or between dummy bond pad layers.

Figure 14:
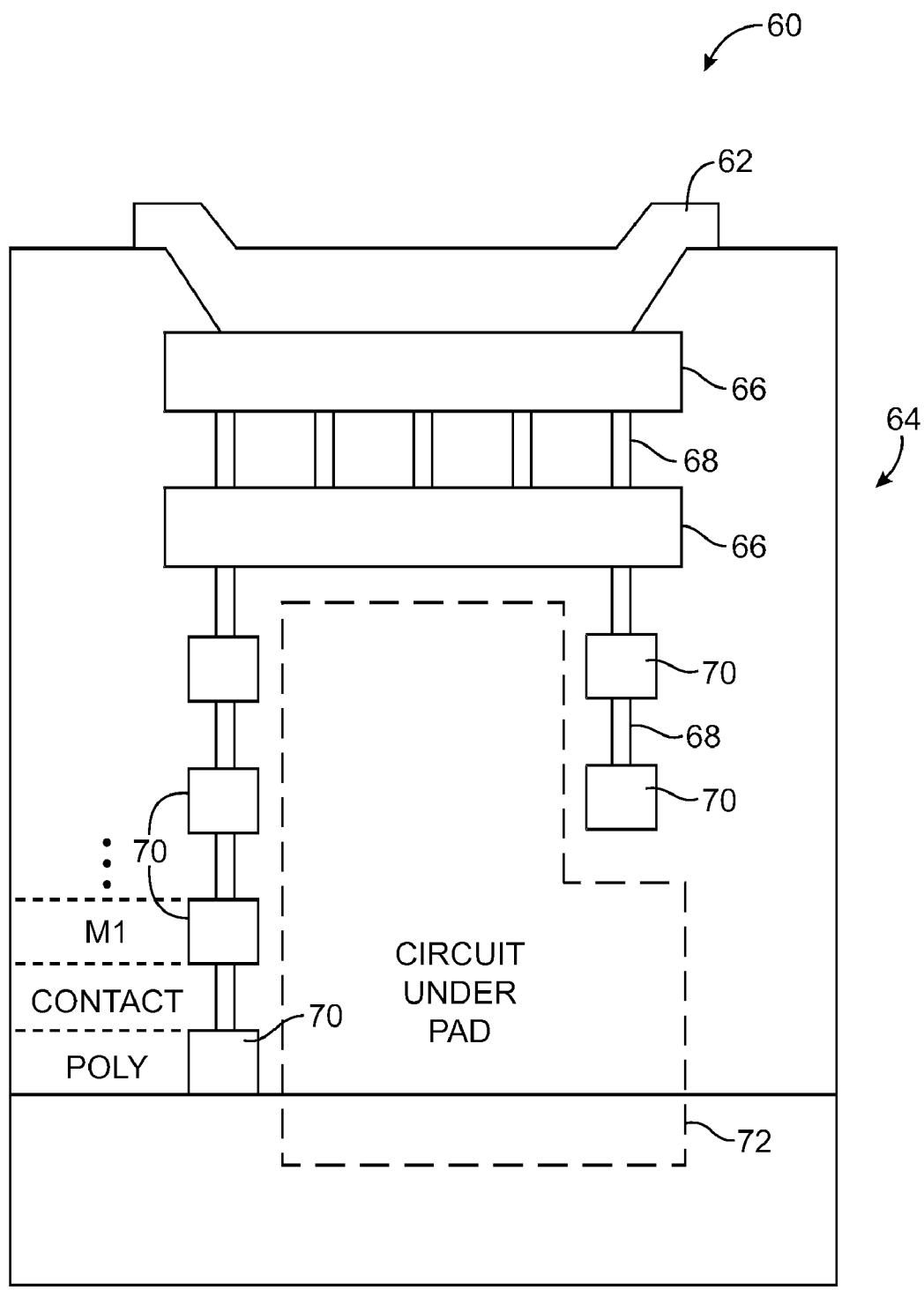

Another arrangement that may be used for bond pad structure 60 is shown in FIG. 14. As shown on the left side of FIG. 14, some of the bond pad structures 70 overlap in each layer and form continuous vertical pillars. As shown on the right side of the drawing, other bond pad support structures 70 form partial pillars that extend only partway down into the dielectric stack 64. In the example of FIG. 14, the poly layer bond pad support structure and the M1 metal interconnect layer bond pad support structure on the right have been omitted. By omitting some of the lower bond pad support structures 70, the under-pad circuit 72 can extend farther out from under the center of the pad.

Omitting vias and bond pad support structures may provide flexibility in designing under-pad circuits, but these omissions tend to weaken the bond pad structure 60. As a result, it is generally desirable to provide as many continuous pillars of bond pad support structures 70 as possible, provided that the total area available for under-pad circuitry does not become overly constricted.

Dummy pads 66 are preferably used near the top of the bond pad structure 60, to provide stability to the structure. In general, there is little or no real estate available in the dummy pad layers for circuitry and few or no gaps available for interconnects. Accordingly, no under pad circuitry is formed in the dummy pad layers. However, because only a relatively small number of metal interconnect layers are used in forming the dummy pads 66, the dummy pads can be provided without unduly limiting the amount of under-pad interconnect resources that are available for under-pad circuits. In general, any suitable layout may be used for the dummy bond pads 66 that provides sufficient structural support for the bond pad structure. Examples of suitable dummy bond pad configurations are shown in FIGS. 15-19.

Figure 15:
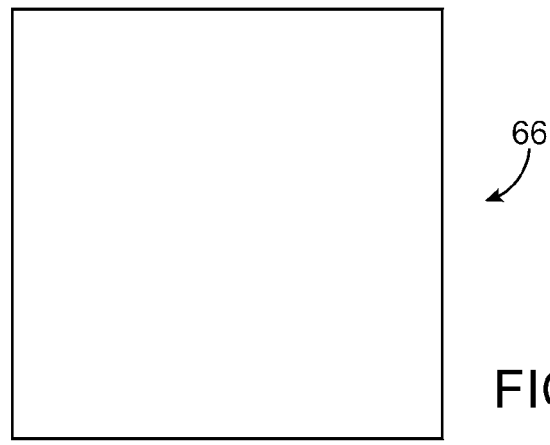
FIGS. 15, 16, 17, 18, and 19 are cross-sectional top views of illustrative dummy bond pads that may be used in bond pad structures in accordance with the present invention.

In the example of FIG. 15, dummy pad 66 is formed from a solid metal plate. This type of configuration is preferred for the uppermost metal interconnect layer (e.g., M8). The uppermost metal interconnect layer is directly connected to bond pad metal 62, so using a solid plate for this dummy pad helps strengthen the pad.

Figure 16:
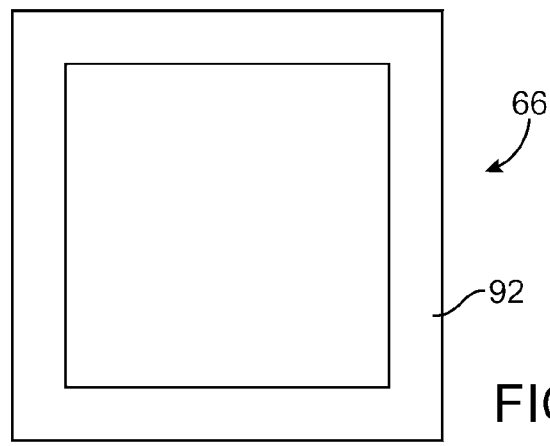

In the example of FIG. 16, a dummy pad 66 is shown that is formed from a metal ring 92. The center of the ring 92 may be unoccupied by metal or may contain patterned metal.

Figure 17:
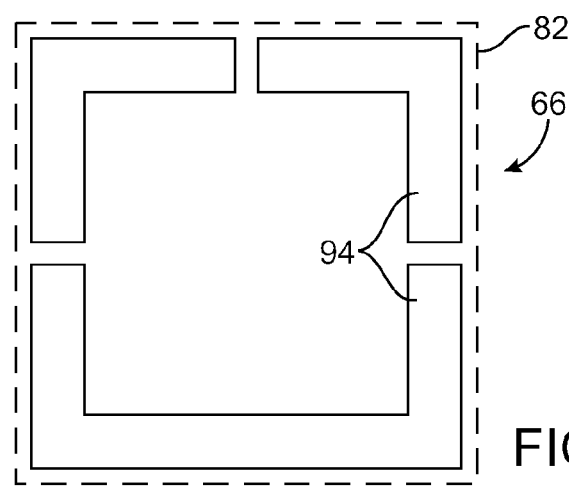

The FIG. 17 arrangement uses a segmented ring for a dummy bond pad 66. The illustrative ring of FIG. 17 has four segments 94. In general, any suitable number of segments may be provided. The center of the FIG. 17 ring structure may be filled with patterned metal or may be left unoccupied.

Figure 18:
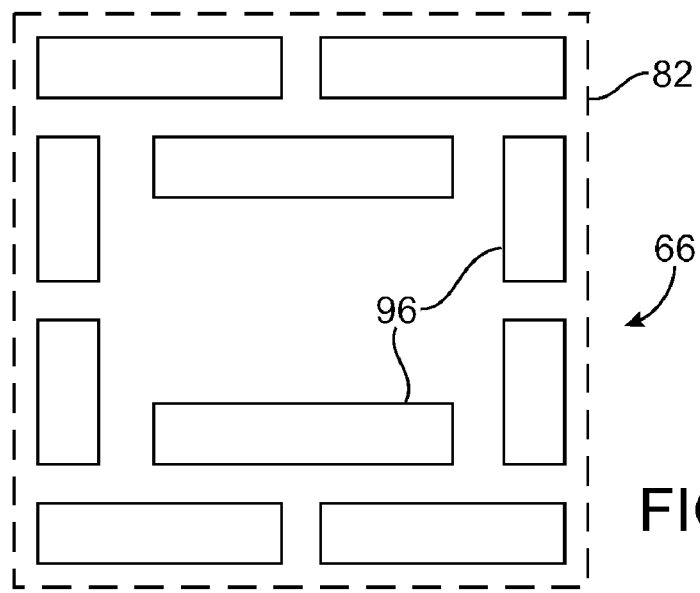

FIG. 18 shows an illustrative configuration for a dummy bond pad 66 that uses a number of metal rectangles 96. The rectangles 96 may be arranged in a ring, arranged to fill in the entire pad boundary 82 (e.g., in a tiled fashion), or may be arranged to partially fill in the pad area, as shown in FIG. 18.

Figure 19:
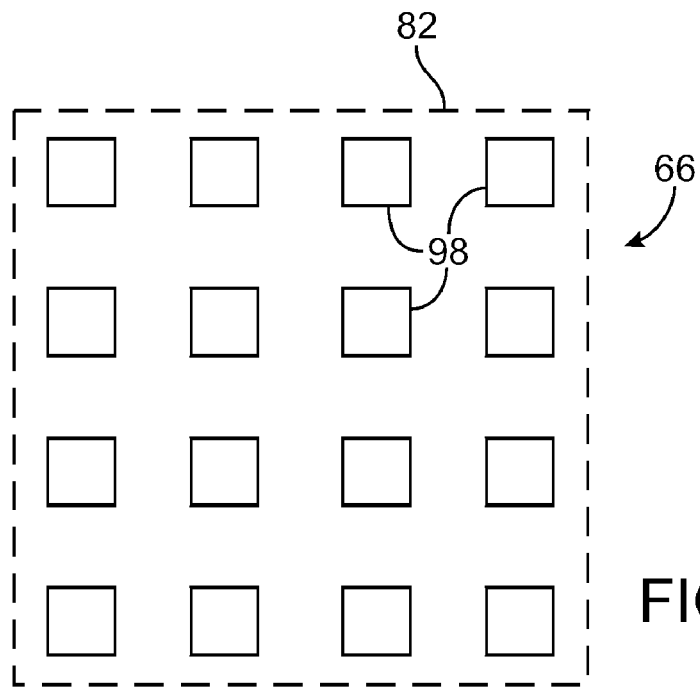

As shown in FIG. 19, dummy bond pads 16 can be formed using an array of metal squares 98. A four by four array of squares 98 is shown in the FIG. 19 example, but any suitable number of squares 98 may be used in a dummy pad if desired.

The dummy pad arrangements of FIGS. 15-19 are merely illustrative. Any suitable arrangements may be used for dummy pads 66 if desired. For example, other patterns of metal shapes may be used to fill in all or some of the pad area defined by boundary 82, combinations of the patterns shown in FIGS. 15-19 may be used, etc.

The foregoing is merely illustrative of the principles of this invention and various modifications can be made by those skilled in the art without departing from the scope and spirit of the invention.

What is claimed is:

1. A bond pad structure formed from a dielectric stack on an integrated circuit, comprising:
   bond pad metal in the shape of a bond pad located on top of the dielectric stack;
   bond pad support structures in a plurality of metal interconnect layers in the dielectric stack under the bond pad metal, wherein the bond pad support structures are under the bond pad metal, wherein in each of the plurality of metal interconnect layers, the bond pad support structures in that metal interconnect layer are configured to form dielectric gaps in that metal interconnect layer; and under-pad circuitry located under the bond pad metal, wherein the under-pad circuitry includes interconnects and wherein some of the interconnects pass from under the bond pad metal to an area not under the bond pad metal through the dielectric gaps to connect the under-pad circuitry to circuitry on the integrated circuit that is not under the bond pad metal.

2. The bond pad structure defined in claim 1 further comprising:
a dummy bond pad formed in the dielectric stack in direct contact with the bond pad metal.

3. The bond pad structure defined in claim 1 further comprising:
at least two dummy bond pads formed in the dielectric stack, wherein one of the two dummy bond pads is formed in direct contact with the bond pad metal and another of the two dummy bond pads is connected to that dummy bond pad using a plurality of vias.

4. The bond pad structure defined in claim 1 further comprising a plurality of layers of vias in the dielectric stack, wherein at least some of the bond pad support structures in each of the plurality of metal interconnect layers are connected to bond pad support structures in other metal interconnect layers by the vias.

5. The bond pad structure defined in claim 1 further comprising:
polysilicon bond pad support structures under the bond pad metal; and
contact-layer metal plugs that connect the polysilicon bond pad support structures to bond pad support structures in an adjacent metal interconnect layer.

6. The bond pad structure defined in claim 1 wherein the bond pad metal has an area, wherein the bond pad support structures in each metal interconnect layer have a respective area, and wherein the area of each layer of bond pad support structures is less than half of the bond pad metal area.

7. The bond pad structure defined in claim 1 wherein there are at least four square bond pad support structures in each of the metal interconnect layers under the bond pad metal.

8. The bond pad structure defined in claim 1 wherein the dielectric stack includes at least five metal interconnect layers, each of which includes some of the bond pad support structures and each of which has a dielectric gap defined by the bond pad support structures.

9. The bond pad structure defined in claim 1 wherein the dielectric stack includes at least eight metal interconnect layers and at least seven via interconnect layers, wherein there are at least two dummy bond pads in the uppermost metal interconnect layers, one of which is directly connected to the bond pad metal and another of which is connected to that dummy bond pad by vias in one of the via interconnect layers, wherein there are some of the bond pad support structures and one of the dielectric gaps defined by the bond pad support structures in each of the metal interconnect layers not containing one of the dummy bond pads, and wherein the bond pad support structures in each layer are connected by vias in the via interconnect layers to bond pad support structures in other metal interconnect layers.

10. The bond pad structure defined in claim 1 wherein the dielectric stack includes via interconnect layers containing vias that connect respective layers of the bond pad support structures, wherein at least one via interconnect layer under the bond pad metal contains no vias.

11. The bond pad structure defined in claim 1 comprising at least eight metal interconnect layers and at least seven via interconnect layers in the dielectric stack, wherein there are first and second dummy bond pads in the eight metal interconnect layers, wherein the first dummy bond pad is a solid copper plate in direct contact with the bond pad metal, wherein each of the metal interconnect layers not containing one of the dummy bond pads contains some of the bond pad support structures, and wherein each layer of the bond pad support structures is connected to another layer of bond pad support structures by vias in one of the via interconnect layers.

12. The bond pad structure defined in claim 1 comprising a polysilicon layer, a contact layer, and at least eight metal interconnect layers and at least seven via interconnect layers in the dielectric stack, wherein there are first and second dummy bond pads in the eight metal interconnect layers, wherein the first dummy bond pad is a solid copper plate in direct contact with the bond pad metal, wherein each of the metal interconnect layers not containing one of the dummy bond pads contains some of the bond pad support structures, wherein each layer of the bond pad support structures is connected to another layer of bond pad support structures by vias in one of the via interconnect layers, wherein there are at least four of the bond pad support structures in each metal interconnect layer, wherein the polysilicon layer contains at least four of the bond pad support structures, and wherein metal plugs in the contact layer connect the polysilicon layer bond pad support structures to corresponding bond pad support structures in a first of the eight metal interconnect layers.

13. A bond pad structure formed on an integrated circuit that includes a plurality of metal interconnect layers, a plurality of via interconnect layers, a contact layer, and a polysilicon layer, comprising:
bond pad metal in the shape of a bond pad located on top of an uppermost one of the metal interconnect layers;
upper and lower dummy bond pads under the bond pad metal, wherein the upper dummy bond pad is in an uppermost one of the metal interconnect layers and is directly connected to the bond pad metal and wherein the lower dummy bond pad is located in an adjacent one of the metal interconnect layers;
under the bond pad metal, at least four bond pad support structures in each of the metal interconnect layers not containing a dummy bond pad and in the polysilicon layer, wherein the bond pad support structures are under the bond pad metal, wherein the bond pad support structures are configured to define dielectric gaps in each of the metal interconnect layers;
under the bond pad metal, vias in each of the via interconnect layers, wherein the vias connect the dummy bond pads to each other, connect the bond pad support structures under the lower dummy bond pad to the lower dummy bond pad, and connect the bond pad support structures in adjacent pairs of the metal interconnect layers to each other;
metal plugs in the contact layer that connect the polysilicon bond pad support structures to respective ones of the bond pad support structures in a lowermost one of the metal interconnect layers; and
under-pad circuitry located under the bond pad metal, wherein the under-pad circuitry includes interconnects and wherein some of the interconnects pass from under the bond pad metal to an area not under the bond pad metal through the dielectric gaps to connect the under-pad circuitry to circuitry on the integrated circuit that is not under the bond pad metal.

14. The bond pad structure defined in claim 13, wherein the integrated circuit is formed on a substrate, wherein the bond pad metal has a pad area, and wherein the bond pad support structures in each metal interconnect layer comprise at least four square bond pad support structures each having an area less than one tenth of the bond pad area, the bond pad support structures being connected by the metal plugs and the vias to form pillars from the substrate to the lower dummy bond pad.

15. The bond pad structure defined in claim 13 wherein the dummy bond pads comprise at least one solid metal plate.

16. A bond pad structure on an integrated circuit having a substrate, a polysilicon layer on the substrate, a contact layer on the polysilicon layer, and a dielectric stack including a plurality of metal interconnect layers and a plurality of via interconnect layers, comprising:
  bond pad metal in the shape of a bond pad on top of the dielectric stack, wherein the bond pad metal has an area;
  bond pad support structures under the bond pad metal in at least a lowermost one of the metal interconnect layers and in the polysilicon layer, wherein the bond pad support structures in each layer comprise at least four square bond pad support structures each having an area less than one tenth of the bond pad area;
  a plurality of metal plugs in the contact layer under the bond pad metal that connect the bond pad support structures in the polysilicon layer to the bond pad support structures in the lowermost one of the metal interconnect layers, wherein the bond pad support structures in the lowermost metal interconnect layer are configured to define at least one dielectric gap in the lowermost metal interconnect layer; and
  under-pad circuitry located under the bond pad metal, wherein the under-pad circuitry includes interconnects in the metal interconnect layers and wherein at least one of the interconnects passes from under the bond pad metal to an area not under the bond pad metal through the dielectric gap to connect the under-pad circuitry to circuitry on the integrated circuit that is not under the bond pad metal.

17. The bond pad structure defined in claim 16 wherein there are at least eight metal interconnect layers and wherein there are bond pad support structures in at least five of the metal interconnect layers, the bond pad structure further comprising:
  vias in the via interconnect layers under the bond pad metal that connect the bond pad support structures in at least each of the five metal interconnect layers to the bond pad support structures in adjacent metal interconnect layers.

18. The bond pad structure defined in claim 16 wherein the square bond pad support structures are aligned and are connected by the vias to form at least four pillars.

19. The bond pad structure defined in claim 16 further comprising a dummy bond pad in an uppermost one of the metal interconnect layers directly connected to the bond pad metal.

20. The bond pad structure defined in claim 16 further comprising at least some bond pad support structures in the metal interconnect layers that are not connected to any of the vias.

* * * * *